United States Patent
McLellan et al.

(10) Patent No.: US 6,667,191 B1
(45) Date of Patent: Dec. 23, 2003

(54) CHIP SCALE INTEGRATED CIRCUIT PACKAGE

(75) Inventors: Neil McLellan, Mid Levels (HK); Wing Him Lau, Yuen Long (HK); Tak Sang Yeung, Tin Shui Wai (HK); Onofre A. Rulloda, Jr., Riviera Gardens (HK)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/211,567

(22) Filed: Aug. 5, 2002

(51) Int. Cl.[7] .......................... H01L 21/44; H01L 23/34
(52) U.S. Cl. .................. 438/121; 438/122; 438/124; 438/125; 438/126; 438/127; 257/712; 257/720; 257/777; 257/780; 257/787
(58) Field of Search ................ 438/120, 121, 438/122, 123, 124, 125, 126, 127; 257/712, 713, 717, 720, 777, 778, 779, 780, 782, 783, 786, 787, 788

(56) References Cited

U.S. PATENT DOCUMENTS

| | | | |
|---|---|---|---|
| 6,392,290 B1 * | 5/2002 | Kasem et al. | 257/774 |
| 6,429,530 B1 * | 8/2002 | Chen | 438/126 |
| 6,441,475 B2 * | 8/2002 | Zandman et al. | 257/710 |
| 6,489,557 B2 * | 12/2002 | Eskildsen et al. | 257/788 |
| 6,498,387 B1 * | 12/2002 | Yang | 257/753 |
| 6,518,089 B2 * | 2/2003 | Coyle | 438/106 |

* cited by examiner

*Primary Examiner*—Kevin M. Picardat
(74) *Attorney, Agent, or Firm*—Keating & Bennett, LLP

(57) ABSTRACT

An integrated circuit package including a silicon wafer, a plate of intermetallic compound fixed to the back surface of the silicon wafer and a plurality of solder ball contacts. The solder ball contacts are in electrical connection with die circuitry on the front surface of the silicon wafer.

20 Claims, 2 Drawing Sheets

CHIP SCALE INTEGRATED CIRCUIT PACKAGE

FIELD OF THE INVENTION

This invention relates in general to integrated circuit packaging, and more particularly to a chip scale integrated circuit package with improved thermo-mechanical properties.

BACKGROUND OF THE INVENTION

Wafer scale, or chip scale packages offer a high density integrated circuit package in comparison to other integrated circuit (IC) packages. Traditionally, chip scale packages have been the preferred packages for use in electronic devices. This is due to the relatively small size of the chip scale package thereby allowing the use of a small circuit board which contains the IC package in the electronic device.

One typical chip scale package of the prior art includes a flip chip integrated circuit with a redistribution layer on the surface of the die to spread the interconnects over the die surface. The redistribution layer is typically an organic dielectric with copper traces routing to the bump areas on the die. These packages have achieved limited use in the industry because they suffer from disadvantages.

One of these disadvantages is that there exists a thermally induced stress due to the mismatch in coefficients of thermal expansion between the die and the motherboard when the chip is soldered to the system motherboard. More specifically, the silicon die has a low coefficient of thermal expansion, typically in the range of about 3 ppm/° C. compared to the high coefficient of thermal expansion (CTE) of the motherboard. Motherboards are typically made from epoxy resin and have a CTE of about 22 ppm/° C. Silicon is a rigid material with a high modulus of elasticity. During temperature cycling, the CTE mismatch creates stresses and strains concentrated on the interconnects between the die and substrate. In extreme cases fatigue failure occurs in the solder joint after a very small number of thermal cycles. Thus, this flip chip design has achieved limited use in a small number of applications using expensive ceramic substrates in controlled environments.

With the introduction of organic underfill techniques, it was determined that by sealing the interface between the die and the motherboard with a connective layer of epoxy adhesive the stress of the thermal mismatch between die and motherboard is spread across the total area under the die. Thus, the stress is spaced across a large area of epoxy rather than concentrated at the weaker solder joints. While this solution is somewhat effective, the implementation of this direct attach technique suffers problems.

One particular problem is that the use of the underfill on the motherboard results in a permanent chip attach. Once a chip is attached, it is extremely difficult to remove or rework it, therefore leading to high scrap rates and other problems. At the time this technique was introduced, technology in motherboard routing could not accommodate the interconnect densities of the direct chip attach. Although motherboard technology has advanced since the introduction of the direct chip attach technique, the use of underfill still suffers disadvantages such as permanent chip attach, which precludes large-scale use of the technique.

Variations to this design have been introduced for a variety of reasons. For example, a discrete ball and array package, commonly referred to as a flip chip ball grid array package has a flipped chip and is underfilled to a discrete component. This permits testing and more effective placement on the motherboard. These devices have achieved common usage but still suffer from the disadvantage of complex construction and high expense. Further, because of the complex construction, these packages generally require more than one test to ensure quality.

Accordingly, it is an object of an aspect of the present invention to provide a chip scale integrated circuit package with improved thermo-mechanical properties.

SUMMARY OF THE INVENTION

In an aspect of the present invention, there is provided an integrated circuit package that includes a silicon wafer, a plate of intermetallic compound fixed to the back surface of the silicon wafer and a plurality of solder ball contacts. The solder ball contacts are in electrical connection with die circuitry on the front surface of the silicon wafer.

In another aspect of the present invention, there is provided a process for fabricating an integrated circuit package including backgrinding a silicon water fixing a first surface of the silicon wafer to a plate of intermetallic compound, adding a redistribution layer to a second surface of the silicon wafer, the second surface opposite the first surface, connecting a plurality of solder balls to die circuitry of the silicon wafer to provide a plurality of joined integrated circuit packages, and singulating individual integrated circuit packages from the joined integrated circuit packages.

In yet another aspect of the present invention, there is provided a chip scale integrated circuit package. The chip scale integrated circuit package includes a silicon wafer back ground to a thickness of between about 25 microns and about 250 microns, and a plate of intermetallic compound fixed to a back surface of the silicon wafer. The intermetallic compound has a coefficient of thermal expansion of about 22 ppm/° C. and an elastic modulus greater than the elastic modulus of the silicon wafer. A redistribution layer is disposed on a surface of the silicon wafer and covers die circuitry on the silicon wafer. A plurality of solder ball contacts are fixed to pads of the redistribution layer and are in electrical connection with die circuitry on the front surface of the silicon wafer.

In an aspect of the present invention, the thermo-mechanical properties of the chip-scale IC package are adapted to approach the temperature induced strain of the motherboard.

Advantageously, the use of an intermetallic compound such as copper aluminide fixed to the silicon wafer provides a hybrid with thermo-mechanical properties that approach that of the motherboard. In one aspect, the coefficient of thermal expansion is close to that of the motherboard and the elastic modulus is high to restrain the silicon.

In another aspect, the package is tested prior to saw singulation. Advantageously, only one test is carried out on each package.

BRIEF DESCRIPTION OF THE DRAWINGS

The invention will be better understood with reference to the drawings, and the following description, in which.

DETAILED DESCRIPTION OF THE PREFERRED EMBODIMENTS

Figure 1A:
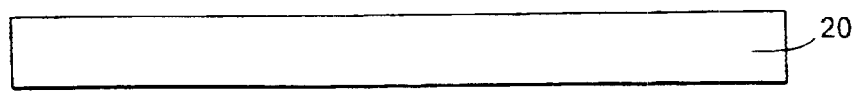
FIGS. 1A to 1F show processing steps for manufacturing an improved chip scale integrated circuit package according to an embodiment of the present invention.
Figure 1B:
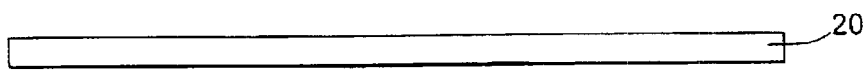

Reference is made to FIGS. 1A to 1F to describe a process for the manufacture of an improved chip scale integrated circuit package according to an embodiment of the present invention. FIG. 1A shows an elevation view of a silicon wafer indicated by the numeral 20. It will be understood that the silicon wafer 20 includes the die circuitry or chip patterns on a front surface thereof.

A back surface of the silicon wafer 20 is then ground down using a backgrinding technique (FIG. 1B), as will be understood by those of skill in the art. Preferably the silicon wafer 20 is ground to a thickness between about 25 microns and about 250 microns.

Figure 1C:
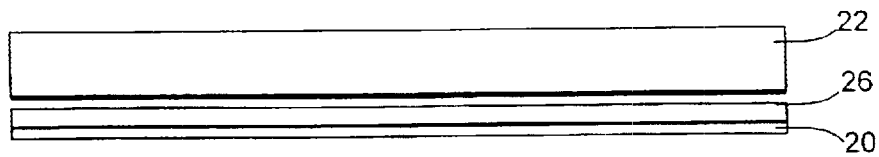

The back surface of the thinned silicon wafer 20 is then fixed to a plate of intermetallic compound 22 using an organic adhesive 26 (FIG. 1C). Intermetallic compounds, also referred to as bulk intermetallics, are chemical compounds based on definite atomic formulas, each with a fixed or narrow range of chemical composition. Thus intermetallic compounds are stoichiometric combinations of metallic ions that form bonded matrices of crystals having desirable thermo-mechanical properties. There are a wide range of intermetallic compounds, the properties of which vary significantly. Preferably, the intermetallic has a CTE in the range of about 18 to about 26 ppm/° C., and more preferably the intermetallic has a CTE of about 22 ppm/° C. Preferably the intermetallic has a high elastic modulus. In the present embodiment, the thinned silicon wafer 20 is laminated to a moderately thicker plate of copper aluminide ($CuAl_3$) using the organic adhesive 26. The copper aluminide has a CTE of about 22 ppm/° C. and a modulus of elasticity that is higher than that of silicon.

Figure 1D:
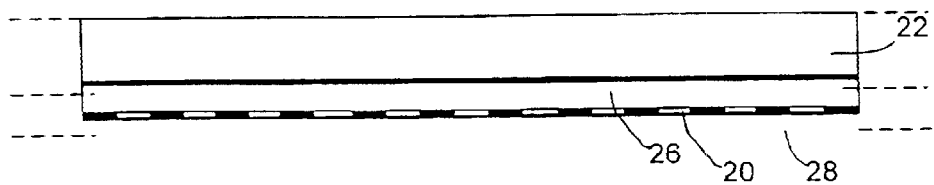

Next, a redistribution layer 28 is added on the front surface of the of the silicon wafer. The redistribution layer 28 is a dieletric layer that includes a coating of polyimide over die circuitry. Holes are etched in the polyimide layer to coincide with peripheral terminals in the die circuitry. Copper is patterned to connect the terminals to an array of solder pads on top of the polyimide layer. The solder pads are then masked with polyimide (FIG. 1D).

Figure 1E:
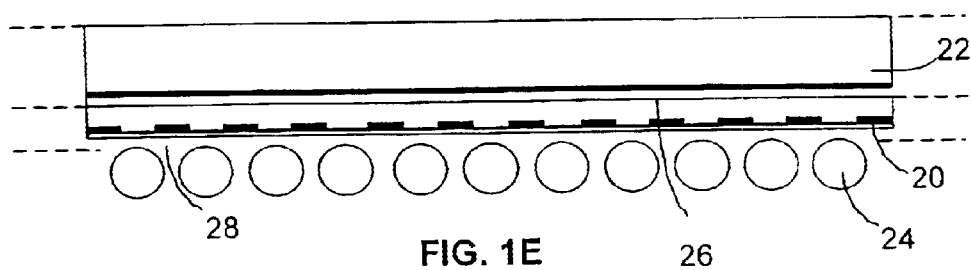

Solder balls 24 (or bumps) are then placed on the pads and reflowed using known reflow techniques to fix the solder balls 24 to the pads (FIG. 1E). The polyimide masking is used to inhibit solder from wetting down the copper interconnects from the array of pads to the die circuitry.

The package is then tested prior to singulation.

Figure 1F:
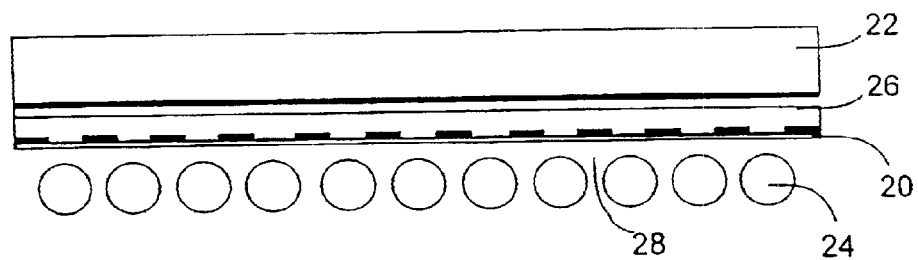

Next, the package is saw singulated (FIG. 1F).

The present invention has been described by way of example. Numerous modifications and variations to the embodiment described herein will occur to those of skill in the art. For example, the thinned silicon wafer 20 can be attached to the intermetallic compound 22 using several other techniques such as by use of liquid epoxy, a B stage film epoxy or a thermoplastic film. Also, other intermetallic compounds can be used. A list of exemplary intermetallic compounds is included below.

| | | | |
|---|---|---|---|
| CoAl | $HfAl_3$ | $Nb_3Al$ | $ZrAl_2$ |
| $FeAl_2$ | $Hf_3Al_2$ | NiAl | $ZrAl_3$ |
| $FeAl_3$ | LiAl | TaAl | $Zr_4Al_3$ |
| $Fe_2Al_5$ | $Mo_3Al$ | $TaAl_3$ | |
| HfAl | $Mo_3Al_8$ | TiAl | |
| $HfAl_2$ | $NbAl_3$ | $TiAl_3$ | |
| CoB | $Fe_2B$ | NiB | $Ni_4B_3$ |
| $Co_2B$ | MnB | $Ni_2B$ | |
| FeB | $Mn_2B$ | $Ni_3B$ | |
| $CeSi_2$ | FeSi | PdSi | $TbSi_2$ |
| CoSi | $FeSi_2$ | $Pd_2Si$ | $Tb_5Si_3$ |

-continued

| | | | |
|---|---|---|---|
| $CoSi_2$ | $Fe_2Si$ | $PrSi_2$ | $TiSi_2$ |
| $CO_2Si$ | $GdSi_2$ | PtSi | $VSi_2$ |
| CrSi | MnSi | $Pt_2Si$ | $V_3Si$ |
| $CrSi_2$ | $MnSi_2$ | ReSi | $V_5Si_3$ |
| $Cr_3Si$ | $Mn_5Si_3$ | $ReSi_2$ | $WSi_2$ |
| $Cu_3Si$ | $MoSi_2$ | $Re_2Si_5$ | Ysi |
| $Cu_5Si$ | $NbSi_2$ | $Si_4Zr_5$ | $Y_3Si_5$ |
| $DySi_2$ | $NdSi_2$ | $SmSi_2$ | $Y_5Si_3$ |
| $ErSi_2$ | NiSi | $SrSi_2$ | $Y_5Si_4$ |
| $EuSi_2$ | $Ni_2Si$ | $TaSi_2$ | $YbSi_2$ |
| CoNb | $Fe_2Ta$ | $Nb_3Ir$ | $TiAl_3$ |
| $CoSm_2$ | $Fe_2Ti$ | $Nd_2Fe_{14}B$ | TiAu |
| CoZr | $Fe_2Zr$ | NiHf | $TiAu_2$ |
| $CoZr_2$ | $Fe_3Y$ | NiTi | TiCo |
| $Co_2Zr$ | HfCo | NiY | TiCu |
| CuY | $HfCo_2$ | NiZr | $TiMn_2$ |
| CuZr | $HfCu_3$ | $NiZr_2$ | $TiNi_3$ |
| $Cu_4Zr$ | $Hf_2Cu$ | $Ni_2$ | TiPd |
| $Fe_{17}Y_2$ | $Hf_2Cu_3$ | $Ni_2Ta$ | $TiPd_3$ |
| $Fe_{17}Yb$ | LaNi | $Ni_3Nb$ | TiPt |
| FeNb | $LaNi_2$ | $Ni_3Ta$ | $TiSi_2$ |
| FeSi | LaPt | $Ni_5Y$ | $Ti_2N_1$ |
| FeTa | $LaPt_5$ | $Ni_5Yb$ | $Ti_3Au$ |
| FeTi | $La_3Ni$ | $Ni_7Hf_2$ | $VSi_2$ |
| $Fe_{23}Tb_5$ | $Mn_{11}Si_{19}$ | $Ni_7Zr_2$ | $WSi_2$ |
| $Fe_{23}Y_6$ | $MnSi_2$ | $Sm_2Co_{17}$ | $ZrCr_2$ |
| $Fe_2Hf$ | $MoSi_2$ | $TaAl_3$ | $ZrSi_2$ |
| $Fe_2Nb$ | $NbSi_2$ | $TaSi_2$ | $Zr_2Cu$ |

It will be appreciated that any intermetallic with the desired material properties can be used. All such modifications and variations are believed to be within the scope and sphere of the present invention.

What is claimed is:

1. A process for fabricating integrated circuit packages comprising:

backgrinding a silicon wafer;

fixing a first surface of said silicon wafer to a plate of intermetallic compound;

adding a redistribution layer to a second surface of said silicon wafer, said second surface opposite said first surface;

connecting a plurality of solder balls to die circuitry of said silicon wafer to provide a plurality of joined integrated circuit packages; and singulating individual integrated circuit packages from said joined integrated circuit packages.

2. The process for fabricating an integrated circuit package according to a claim 1 wherein said integrated circuit packages are tested prior to singulating.

3. The process for fabricating an integrated circuit package according to claim 1 wherein said backgrinding includes grinding and polishing said silicon wafer.

4. The process of fabricating an integrated circuit package according to claim 1 wherein said plate of intermetallic compound comprises an intermetallic compound having a coefficient of thermal expansion of from about 18 ppm/° C. to about 26 ppm/° C.

5. The process for fabricating an integrated circuit package according to claim 1 wherein said plate of intermetallic compound comprises an intermetallic compound having a coefficient of thermal expansion of about 22 ppm/° C.

6. The process for fabricating an integrated circuit package according to claim 1 wherein said plate of intermetallic compound is comprised of an intermetallic compound selected from the group consisting of: CoAl, $FeAl_2$, $FeAl_3$, $Fe_2Al_5$, $CuAl_3$, HfAl, $HfAl_2$, $HfAl_3$, $HF_3Al_2$, LiAl, $Mo_3Al$, $Mo_3Al_8$, $NbAl_3$, $Nb_3Al$, NiAl, TaAl, $TaAl_3$, TiAl, $TiAl_3$, $ZrAl_2$, $ZrAl_3$, CoB, $Co_2B$, FeB, $Fe_2B$, MnB, $Mn_2B$, NiB, $Ni_2B$, $Ni_3B$, $Ni_4B_3$, $CeSi_2$, $CoSi$, $CoSi_2$, $Co_2Si$, $CrSi$, $CrSi_2$, $Cr_3Si$, $Cu_3Si$, $Cu_5Si$, $DySi_2$, $ErSi_2$, $EuSi_2$, $FeSi$, $FeSi_2$, $Fe_2Si$, $GdSi_2$, $MnSi$, $MnSi_2$, $Mn_5Si_3$, $MoSi_2$, $NbSi_2$, $NdSi_2$, $NiSi$, $Ni_2Si$, $PdSi$, $Pd_2Si$, $PrSi_2$, $PtSi$, $Pt_2Si$, $ReSi$, $ReSi_2$, $Re_2Si_5$, $Si_4Zr_5$, $SmSi_2$, $SrSi_2$, $TaSi_2$, $TbSi_2$, $Tb_5Si_3$, $TiSi_2$, $VSi_2$, $V_3Si$, $V_5Si_3$, $WSi_2$, $Ysi$, $Y_3Si_5$, $Y_5Si_3$, $Y_5Si_4$, $CoNb$, $CoSm_2$, $CoZr$, $CoZr_2$, $Co_2Zr$, $CuY$, $CuZr$, $Cu_4Zr$, $Fe_{17}Y_2$, $Fe_{17}Yb$, $FeNb$, $FeSi$, $FeTa$, $FeTi$, $Fe_{23}Tb_5$, $Fe_{23}Y_6$, $Fe_2Hf$, $Fe_2Nb$, $Fe_2Ta$, $Fe_2Ti$, $Fe_2Zr$, $Fe_3Y$, $HfCo$, $HfCo_2$, $HfCu_3$, $Hf_2Cu$, $Hf_2Cu_3$, $LaNi$, $LaNi_5$, $LaPt$, $LaPT_5$, $La_3Ni$, $Mn_{11}Si_{19}$, $MnSi_2$, $MoSi_2$, $NbSi_2$, $Nb_3Ir$, $Nd_2Fe_{14}B$, $NiHf$, $NiTi$, $NiY$, $NiZr$, $NiZr_2$, $Ni_2$, $Ni_2Ta$, $Ni_3Nb$, $Ni_3Ta$, $Ni_5Y$, $Ni_5Yb$, $Ni_7Hf_2$, $Ni_7Zr_2$, $Sm_2Co_{17}$, $TaAl_3$, $TaSi_2$, $TiAl_3$, $TiAu$, $TiAu_2$, $TiCo$, $TiCu$, $TiMn_2$, $TiNi_3$, $TiPd$, $TiPd_3$, $TiPt$, $TiSi_2$, $Ti_2Ni$, $Ti_3Au$, $VSi_2$, $WSi_2$, $ZrCr_2$, $ZrSi_2$ and $Zr_2Cu$.

7. The process for fabricating an integrated circuit package according to claim 1 wherein said plate of intermetallic compound comprises $CuAl_3$.

8. The process for fabricating an integrated circuit package according to claim 1 wherein said intermetallic compound has a modulus of elasticity at least in the range of the modulus of elasticity of silicon.

9. The process for fabricating an integrated circuit package according to claim 3 wherein said silicon wafer is ground to a thickness of between about 50 microns and about 250 microns.

10. The process of fabricating an integrated circuit package according to claim 1 wherein said redistribution layer comprises a dieletric layer including polyimide with copper interconnects between terminals of the die circuitry and an array of solder pads on said polyimide.

11. The process of fabricating an integrated circuit package according to claim 10 wherein said solder ball contacts are fixed to said solder pads.

12. An integrated circuit package comprising:
   a silicon wafer;
   a plate of intermetallic compound fixed to a back surface of said silicon wafer; and
   a plurality of solder ball contacts in electrical connection with die circuitry on a front surface of said silicon wafer.

13. The integrated circuit package according to claim 12 wherein said plate of intermetallic compound comprises an intermetallic compound having a coefficient of thermal expansion of from about 18 ppm/° C. to about 26 ppm/° C.

14. The integrated circuit package according to claim 12 wherein said plate of intermetallic compound comprises an intermetallic compound having a coefficient of thermal expansion of about 22 ppm/° C.

15. The integrated circuit package according to claim 12 wherein said plate of intermetallic compound is comprised of an intermetallic compound selected from the group consisting of: $CoAl$, $FeAl_2$, $FeAl_3$, $Fe_2Al_5$, $CuAl_3$, $HfAl$, $HfAl_2$, $HfAl_3$, $Hf_3Al_2$, $LiAl$, $Mo_3Al$, $Mo_3Al_8$, $NbAl_3$, $Nb_3Al$, $NiAl$, $TaAl_3$, $TiAl$, $TiAl_3$, $ZrAl_2$, $ZrAl_3$, $Zr_4Al_3$, $CoB$, $Co_2B$, $FeB$, $Fe_2B$, $MnB$, $Mn_2B$, $NiB$, $Ni_2B$, $Ni_3B$, $Ni_4B_3$, $CeSi_2$, $CoSi$, $CoSi_2$, $Co_2Si$, $CrSi$, $CrSi_2$, $Cr_3Si$, $Cu_3Si$, $Cu_5Si$, $DySi_2$, $ErSi_2$, $EuSi_2$, $FeSi$, $FeSi_2$, $Fe_2Si$, $GdSi_2$, $MnSi$, $MnSi_2$, $Mn_5Si_3$, $MoSi_2$, $NbSi_2$, $NdSi_2$, $NiSi$, $Ni_2Si$, $PdSi$, $Pd_2Si$, $PrSi_2$, $PtSi$, $Pt_2Si$, $ReSi$, $ReSi_2$, $Re_2Si_5$, $Si_4Sr_5$, $SmSi_2$, $SrSi_2$, $TaSi_2$, $TbSi_2$, $Tb_5Si_3$, $TiSi_2$, $VSi_2$, $V_3Si$, $V_5Si_3$, $WSi_2$, $Ysi$, $Y_3Si_5$, $Y_5Si_3$, $Y_5Si_4$, $YbSi_2$, $CoNb$, $CoSm_2$, $CoZr$, $CoZr_2$, $Co_2Sr$, $CuY$, $CuZr$, $Cu_4Zr$, $Fe_{17}Y_2$, $Fe_{17}Yb$, $FeNb$, $FeSi$, $FeTa$, $FeTi$, $Fe_{23}Tb_5$, $Fe_{23}Y_6$, $Fe_2Hf$, $Fe_2Nb$, $Fe_2Ta$, $Fe_2Ti$, $Fe_2Zr$, $Fe_3Y$, $HfCo$, $HfCo_2$, $HfCu_3$, $Hf_2Cu$, $Hf_2Cu_3$, $LaNi$, $LaNi_5$, $LaPt$, $LaPt_5$, $La_3Ni$, $Mn_{11}Si_{19}$, $MnSi_2$, $MoSi_2$, $NbSi_2$, $Nb_3Ir$, $Nd_2Fe_{14}B$, $NiHf$, $NiTi$, $NiY$, $NiZr$, $NiZr_2$, $Ni_2$, $Ni_2Ta$, $Ni_3Nb$, $Ni_3Ta$, $Ni_5Y$, $Ni_5Yb$, $Ni_7Hf_2$, $Ni_7Zr_2$, $Sm_2Co_{17}$, $TaAl_3$, $TaSi_2$, $TiAl_3$, $TiAu$, $TiAu_2$, $TiCo$, $TiCu$, $TiMn_2$, $TiNi_3$, $TiPd$, $TiPd_3$, $TiPt$, $TiSi_2$, $Ti_2Ni$, $Ti_3Au$, $VSi_2$, $WSi_2$, $ZrCr_2$, $ZrSi_2$, and $Zr_2Cu$.

16. The integrated circuit package according to claim 12 wherein said plate of intermetallic compound comprises $CuAl_3$.

17. The integrated circuit package according to claim 12 wherein said intermetallic compound has a modulus of elasticity at least in the range of the modulus of elasticity of silicon.

18. The integrated circuit package according to claim 12 further comprising a redistribution layer disposed on a front surface of said silicon wafers, wherein said solder ball contacts are connected to an array of pads which are connected to peripheral terminals of the die circuitry.

19. The integrated circuit package according to claim 12 wherein said silicon wafer has a thickness of between about 25 microns and about 200 microns.

20. A chip scale integrated circuit package comprising:
   a silicon wafer back ground to a thickness of between about 25 microns and about 250 microns;
   a plate of intermetallic compound fixed to a back surface of said silicon wafer, the intermetallic compound having a coefficient of thermal expansion of about 22 ppm/° C. and an elastic modulus at least in the range of the elastic modulus of the silicon wafer;
   a redistribution layer on a surface of said silicon wafer and covering die circuitry on said silicon wafer; and
   a plurality of solder ball contacts fixed to pads of said redistribution layer in electrical connection with die circuitry on a front surface of said silicon wafer.

* * * * *